US012591757B2

(12) United States Patent
Smith et al.

(10) Patent No.: US 12,591,757 B2
(45) Date of Patent: Mar. 31, 2026

(54) CARRIER CARD WITH REDUCED WIDTH

(71) Applicant: RADX Technologies, Inc., Palo Alto, CA (US)

(72) Inventors: Ross Q. Smith, San Jose, CA (US); Elliot Mitchell Berg, Albuquerque, NM (US); Allen Erik Sjogren, Park City, UT (US); Alexander Paul Favero, Salt Lake City, UT (US)

(73) Assignee: RADX Technologies, Inc., Palo Alto, CA (US)

( * ) Notice: Subject to any disclaimer, the term of this patent is extended or adjusted under 35 U.S.C. 154(b) by 201 days.

(21) Appl. No.: 18/239,544

(22) Filed: Aug. 29, 2023

(65) Prior Publication Data
US 2024/0070429 A1     Feb. 29, 2024

Related U.S. Application Data

(60) Provisional application No. 63/401,788, filed on Aug. 29, 2022.

(51) Int. Cl.
*G06K 19/077* (2006.01)
*G06K 13/08* (2006.01)
*H05K 7/14* (2006.01)

(52) U.S. Cl.
CPC ....... *G06K 19/07739* (2013.01); *G06K 13/08* (2013.01); *H05K 7/1418* (2013.01)

(58) Field of Classification Search
None
See application file for complete search history.

(56) References Cited

U.S. PATENT DOCUMENTS 3,457,621 A * 7/1969 Decker .............. H01R 13/6335
                                              29/764
3,711,814 A * 1/1973 Pomella ............... H05K 7/1435
                                              361/801
3,760,233 A * 9/1973 Warwick .............. H05K 7/1418
                                              361/756
(Continued)

FOREIGN PATENT DOCUMENTS

CN        221149253 U  *  6/2024

OTHER PUBLICATIONS

PNY Quadro K1200. Amazon. https://www.amazon.com/PNY-Technologies-VCQK1200DP-PB-Quadro-Display/dp/B00V9SZPOS/ (Year: 2014).*
(Continued)

*Primary Examiner* — Timothy J. Dole
*Assistant Examiner* — Muhammed Azam
(74) *Attorney, Agent, or Firm* — Polsinelli LLP

(57) ABSTRACT
A carrier card includes a U-shaped design. A daughter card mounts in a void in the carrier card in a co-planar fashion. The carrier card includes an upper member; a lateral member, a lower member and a front panel with optional snout. The lateral member or other member includes a carrier card electrical and/or optical connector. The lower member or other member includes a mating electrical and/or optical connector to connect with the daughter card. The upper member, the lateral member, and the lower member form or define the void. A front panel connects with the upper and lower member and, optionally, the daughter card.

29 Claims, 6 Drawing Sheets

(56) References Cited

U.S. PATENT DOCUMENTS

| | | | | |
|---|---|---|---|---|
| 3,932,016 A * | 1/1976 | Ammenheuser | H05K 7/1418 | 361/801 |
| 4,002,381 A * | 1/1977 | Wagner | H05K 7/1439 | 361/801 |
| 4,887,188 A * | 12/1989 | Yoshida | G06K 13/0806 | 439/153 |
| 5,113,317 A * | 5/1992 | Howe | H05K 7/1418 | 361/756 |
| 5,594,627 A * | 1/1997 | Le | H05K 7/1418 | 361/752 |
| 5,646,369 A * | 7/1997 | Miska | H05K 7/1441 | 174/363 |
| 5,889,649 A * | 3/1999 | Nabetani | H05K 5/0265 | 361/740 |
| 5,963,681 A * | 10/1999 | Clements | H05K 7/1418 | 385/901 |
| 5,984,688 A * | 11/1999 | Norris | G06F 1/183 | 439/945 |
| 6,053,760 A * | 4/2000 | Bailis | H05K 7/1429 | 439/377 |
| 6,078,504 A * | 6/2000 | Miles | G06F 1/184 | 361/752 |
| 6,116,566 A * | 9/2000 | Brown | H05K 7/1431 | 361/740 |
| 6,157,536 A * | 12/2000 | Huang | H05K 7/1405 | 361/740 |
| 6,158,594 A * | 12/2000 | Boe | G06F 1/184 | 211/41.17 |
| 6,166,917 A * | 12/2000 | Anderson | H05K 7/1418 | 361/752 |
| 6,247,078 B1 * | 6/2001 | Ebert | H05K 7/20718 | 439/59 |
| 6,585,534 B2 * | 7/2003 | Llapitan | H01L 23/4093 | 257/E23.086 |
| 7,014,118 B1 * | 3/2006 | Ramey | G06K 13/08 | 235/479 |
| 7,019,392 B2 * | 3/2006 | Iwasaki | G06K 19/07739 | 257/361 |
| 7,137,855 B2 * | 11/2006 | Koughan | G06F 1/186 | 439/928.1 |
| 7,167,380 B2 * | 1/2007 | Ice | H05K 7/1404 | 361/756 |
| 7,210,586 B2 * | 5/2007 | Ice | H05K 7/1418 | 361/756 |
| 7,254,038 B2 * | 8/2007 | Drako | G06F 1/185 | 361/752 |
| 7,283,921 B2 * | 10/2007 | Chandwani | H04Q 1/20 | 374/100 |
| 7,360,709 B2 * | 4/2008 | Robinson | G06K 13/085 | 235/475 |
| 7,419,383 B2 * | 9/2008 | Zheng | H05K 7/1069 | 439/71 |
| 7,486,527 B1 * | 2/2009 | Yang | G06F 1/186 | 361/740 |
| 7,539,183 B2 * | 5/2009 | Harris | G06F 13/409 | 370/386 |
| 7,561,439 B2 * | 7/2009 | Orr | H05K 7/1441 | 361/752 |
| 7,593,233 B2 * | 9/2009 | Mueller | H05K 7/1424 | 361/752 |
| 7,604,486 B2 * | 10/2009 | Martinson | H05K 7/1069 | 439/70 |
| 7,746,639 B2 * | 6/2010 | Bopp | H05K 7/1475 | 174/16.3 |
| 7,848,116 B2 * | 12/2010 | Duppong | H01R 12/7029 | 361/801 |
| 7,889,508 B2 * | 2/2011 | Sato | H05K 7/1461 | 361/741 |
| 8,240,559 B2 * | 8/2012 | Chen | G06K 13/08 | 235/380 |
| 8,274,787 B2 * | 9/2012 | Alyaser | G06F 1/20 | 361/679.52 |
| 8,961,207 B2 * | 2/2015 | Lim | H01R 13/6335 | 439/159 |
| 9,161,475 B2 * | 10/2015 | Ng | H05K 7/1487 | |
| 9,172,165 B1 * | 10/2015 | Sass | G06F 1/185 | |
| 9,304,557 B2 * | 4/2016 | Herman | G06F 1/181 | |
| 9,363,919 B2 * | 6/2016 | Ke | H05K 7/1439 | |
| 9,490,560 B2 * | 11/2016 | Chawla | H01R 43/205 | |
| 9,781,861 B2 * | 10/2017 | Tan | G06F 1/3206 | |
| 9,870,035 B2 * | 1/2018 | Birke | G06F 1/186 | |
| 10,224,652 B2 * | 3/2019 | Herring | H01R 12/737 | |
| 10,251,298 B1 * | 4/2019 | Lin | G06F 1/183 | |
| 10,268,847 B2 * | 4/2019 | Sardaryan | G06F 13/4282 | |
| 10,477,707 B1 * | 11/2019 | Petersen | H05K 5/0069 | |
| 10,645,835 B1 * | 5/2020 | Sauer | H05K 7/1461 | |
| 10,729,030 B1 * | 7/2020 | Cousineau | G06F 13/409 | |
| 10,856,409 B1 * | 12/2020 | Chuang | H05K 1/0278 | |
| 11,032,932 B1 * | 6/2021 | Chen | H05K 5/0286 | |
| 11,047,407 B2 * | 6/2021 | Wang | H05K 7/1409 | |
| 11,073,873 B1 * | 7/2021 | Sover | H05K 1/117 | |
| 11,132,034 B2 * | 9/2021 | Nguyen | H05K 7/1417 | |
| 11,317,532 B2 * | 4/2022 | Shih | G06F 1/184 | |
| 11,632,868 B2 * | 4/2023 | Yu | H05K 5/0286 | 439/367 |
| 11,678,444 B2 * | 6/2023 | Elenitoba-Johnson | G06F 13/409 | 361/752 |
| 11,930,620 B2 * | 3/2024 | Ku | G06F 1/203 | |
| 11,949,189 B2 * | 4/2024 | Morgan | H05K 5/006 | |
| 12,261,396 B2 * | 3/2025 | Chen | H01R 12/737 | |
| 12,295,114 B2 * | 5/2025 | Lin | H05K 7/1489 | |
| 12,444,869 B2 * | 10/2025 | Mann | H01R 12/735 | |
| 2003/0235042 A1 * | 12/2003 | Harris | H05K 7/1429 | 361/752 |
| 2008/0244052 A1 * | 10/2008 | Bradicich | H05K 7/1492 | 361/600 |
| 2009/0215285 A1 * | 8/2009 | Creasy | H01R 12/721 | 439/60 |
| 2009/0284923 A1 * | 11/2009 | Rytka | H05K 7/20936 | 361/700 |
| 2013/0216303 A1 * | 8/2013 | Tang | F16B 2/245 | 403/326 |
| 2017/0371383 A1 * | 12/2017 | Yang | F16B 21/02 | |
| 2018/0006391 A1 * | 1/2018 | Alcorn | H01R 12/778 | |
| 2018/0303004 A1 * | 10/2018 | Zhai | G06F 13/1668 | |
| 2020/0241608 A1 * | 7/2020 | Ko | H01R 12/725 | |
| 2024/0070429 A1 * | 2/2024 | Smith | G06K 19/07739 | |
| 2024/0130068 A1 * | 4/2024 | Wang | G06F 1/183 | |
| 2025/0208672 A1 * | 6/2025 | Lin | G06F 1/185 | |

OTHER PUBLICATIONS

PNY Quadro K2200 Graphic Card. Amazon. https://www.amazon.com/PNY-Quadro-K2200-Graphic-Card/dp/B00NTBWCRQ (Year: 2015).*

StarTech.com 4 Port PCIe Network Card. Amazon. https://www.amazon.com/StarTech-com-4-Port-Gigabit-Ethernet-Network/dp/B011NLWNHC (Year: 2015).*

* cited by examiner

CARRIER CARD WITH REDUCED WIDTH

CROSS-REFERENCE TO RELATED APPLICATIONS

This application claims priority to U.S. Provisional Patent Application No. 63/401,788 filed Aug. 29, 2022, which is hereby incorporated by reference in its entirety.

FIELD OF INVENTION

The present invention relates to a carrier card with reduced width.

BACKGROUND OF INVENTION

Daughter or mezzanine cards are typically mounted on a side surface of carrier cards to form a combined assembly. The combined assembly, including the carrier card and the daughter card(s), have a combined width that often exceeds the standard "slot" width supported by the carrier card's target format since the combined assembly's width may physically intrude into or block access to an adjacent slot. This therefore requires the use of an "extra slot", which is wasteful, and may be untenable in slot-limited or fully populated systems.

SUMMARY

A carrier card with reduced width is described. The carrier card includes a U-shaped design of the carrier card's printed circuit board (PCB). A daughter card mounts to the carrier card in a co-planar fashion. This reduces the combined width of the assembly of the daughter card and the carrier card. In many cases, this may avoid the need for an extra slot, which is helpful in motherboard-based or backplane-based systems where slots are precious.

A variety of daughter cards may be mounted to the carrier card. The carrier card enables the daughter card, which is typically in a different (usually smaller) form factor, to be used in a system that is based on the standard to which the carrier card conforms.

The daughter cards may include printed circuit board cards or modules that are not typically designed as a daughter or mezzanine card.

In one aspect, a carrier card printed circuit board (PCB) with a front panel is described. The carrier card includes an upper member, a lateral member, a lower member, and the front panel. The front panel may include an optional snout portion. One or more of the upper member, the lateral member, or the lower member may include electrical circuitry to interface a daughter card to the carrier card's system infrastructure. One or more of the upper member, the lateral member, or the lower member of the carrier card PCB may include a carrier card electrical and/or optical connector. In backplane systems, the member equipped with the carrier card connector will usually be the lateral member. One of the upper member, the lateral member, or the lower member will include a mating electrical and/or optical connector to connect with the electrical and/or optical connector of the daughter card. In most backplane or motherboard systems, the lower member will be equipped with the mating electrical and/or optical connector. One or more of the upper member, the lateral member, or the lower member may include mounting brackets that are used to secure the daughter card via friction, fasteners or other methods.

The front panel connects to the carrier card PCB, and in certain aspects, the front panel may also connect to the daughter card, via fasteners, friction or other methods. The front panel may provide the ability to secure the carrier card assembly in a chassis with backplane slots and a chassis front panel or similarly in a system with a motherboard and brackets. The front panel also provides input/output from the daughter card, if required. In aspects where the daughter card I/O needs to extend beyond the front panel, the front panel may include a snout to support the extended I/O.

The upper member, the lateral member, and the lower member form or define a void. The daughter card may nest inside of the void of the carrier card. The void may receive the daughter card in a coplanar arrangement such that the printed circuit board of the daughter card aligns with the printed circuit board of the carrier card, thereby reducing the overall width of the combined carrier card and daughter card assembly.

DETAILED DESCRIPTION OF INVENTION

Figures 1, 2:
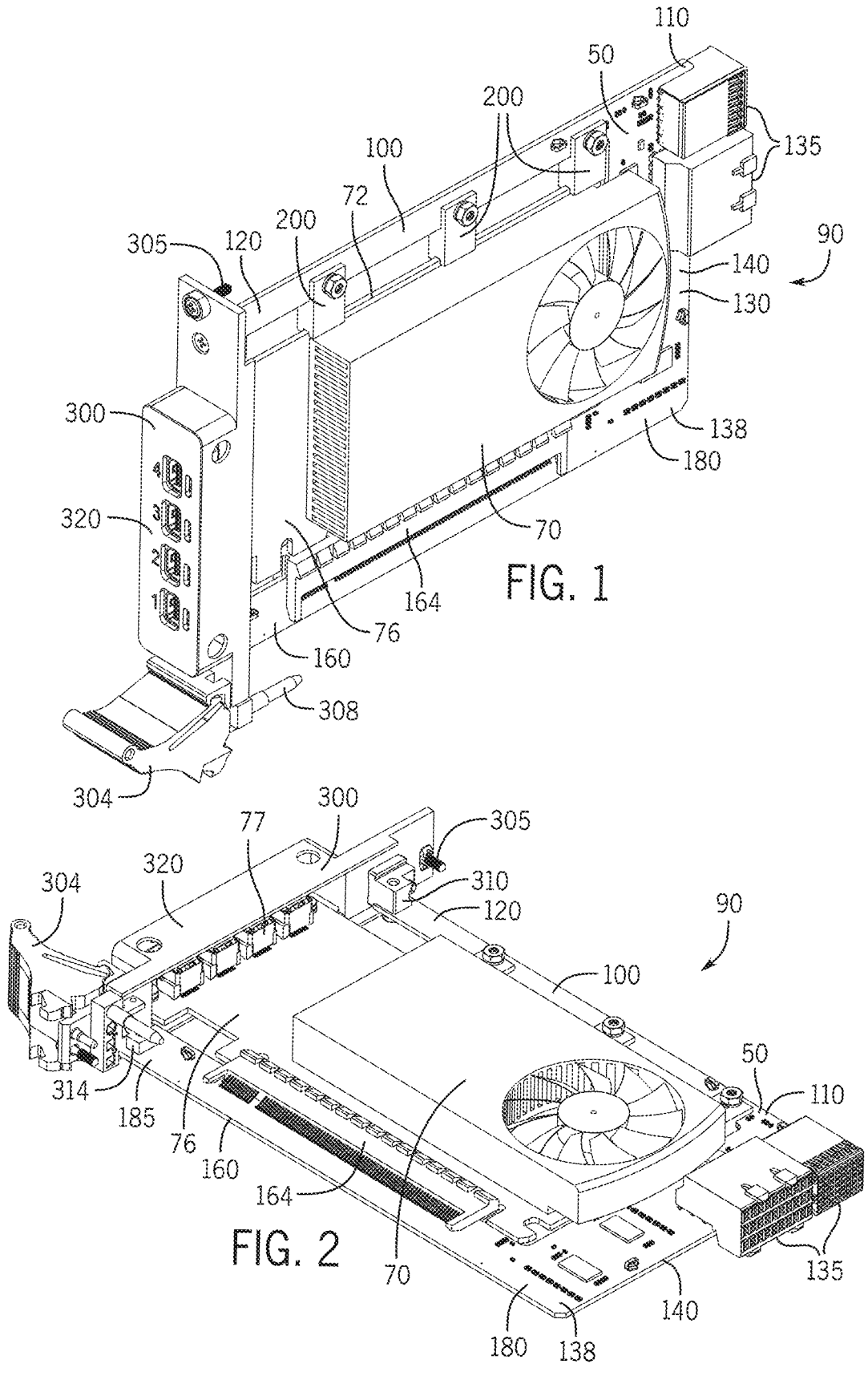
FIG. 1 is a perspective view of the carrier card assembly.
FIG. 2 is a perspective view of the carrier card assembly.
Figure 3:
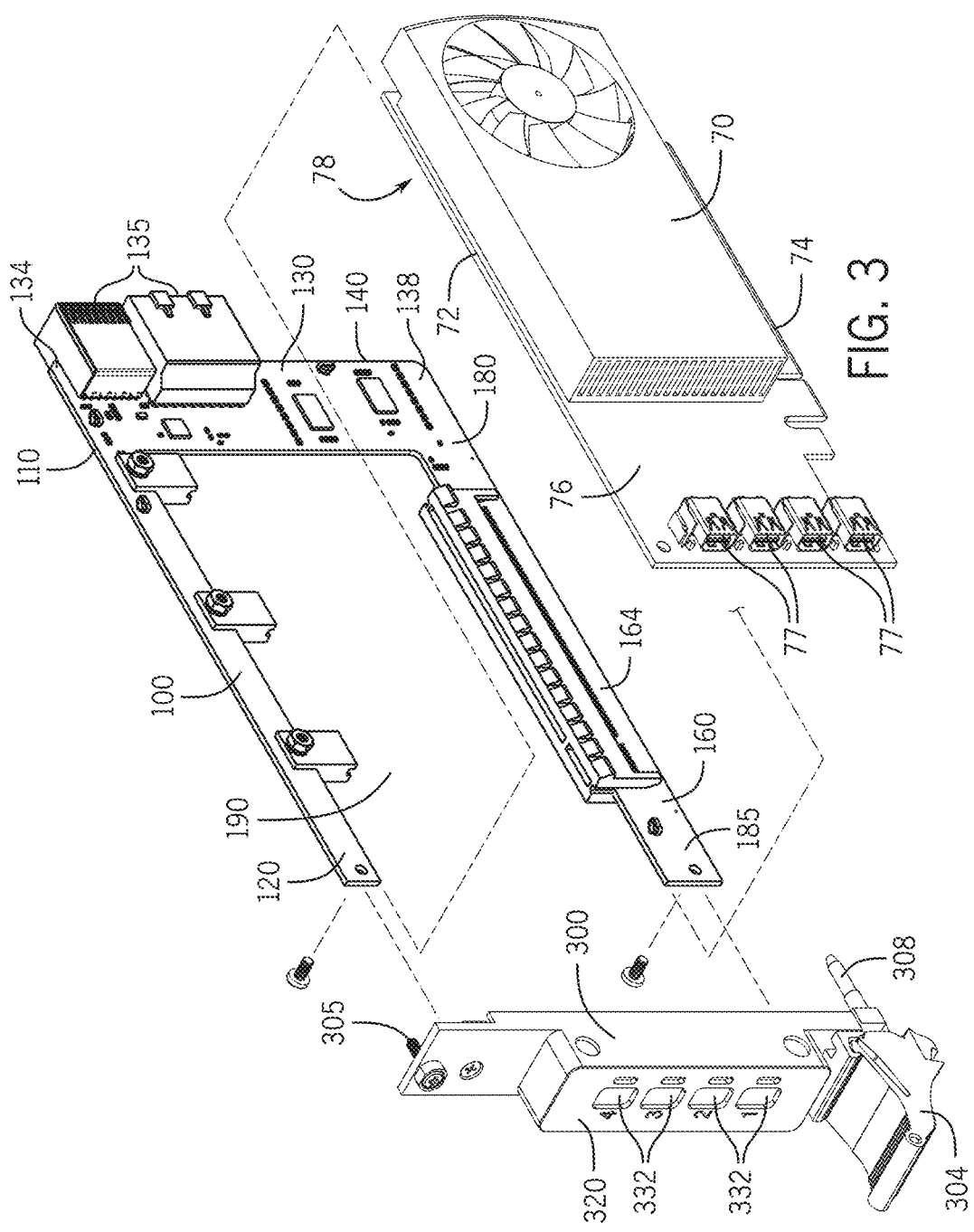
FIG. 3 is an exploded view of the carrier card assembly.
Figure 4:
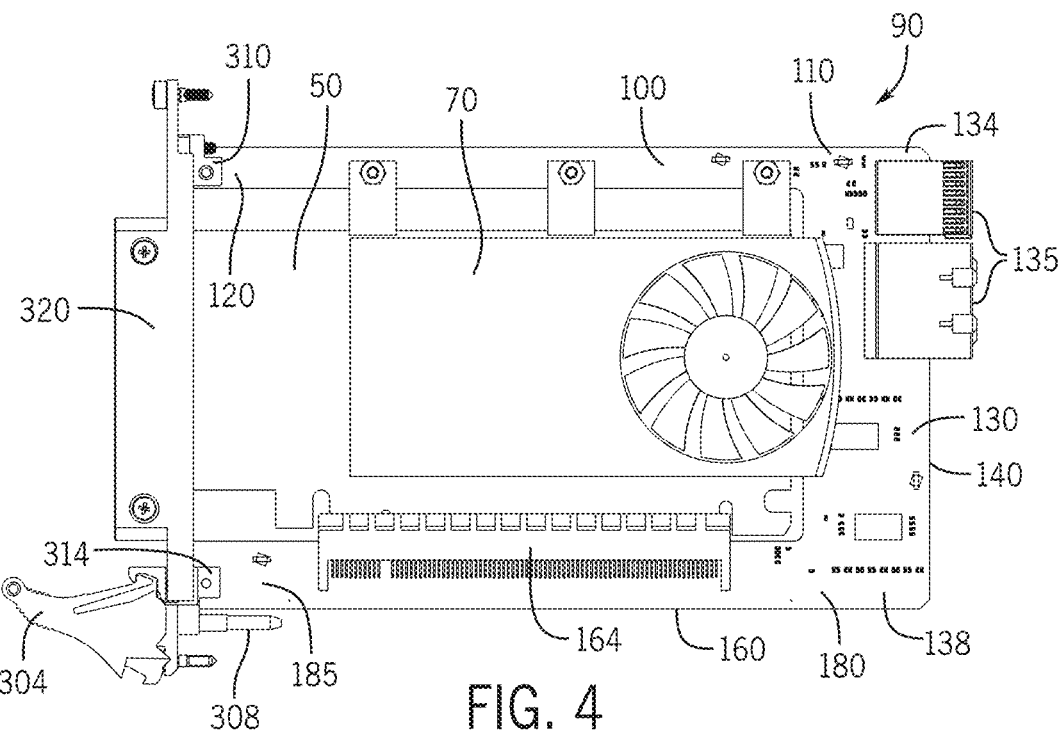
FIG. 4 is a side view of the carrier card assembly.
Figure 5:
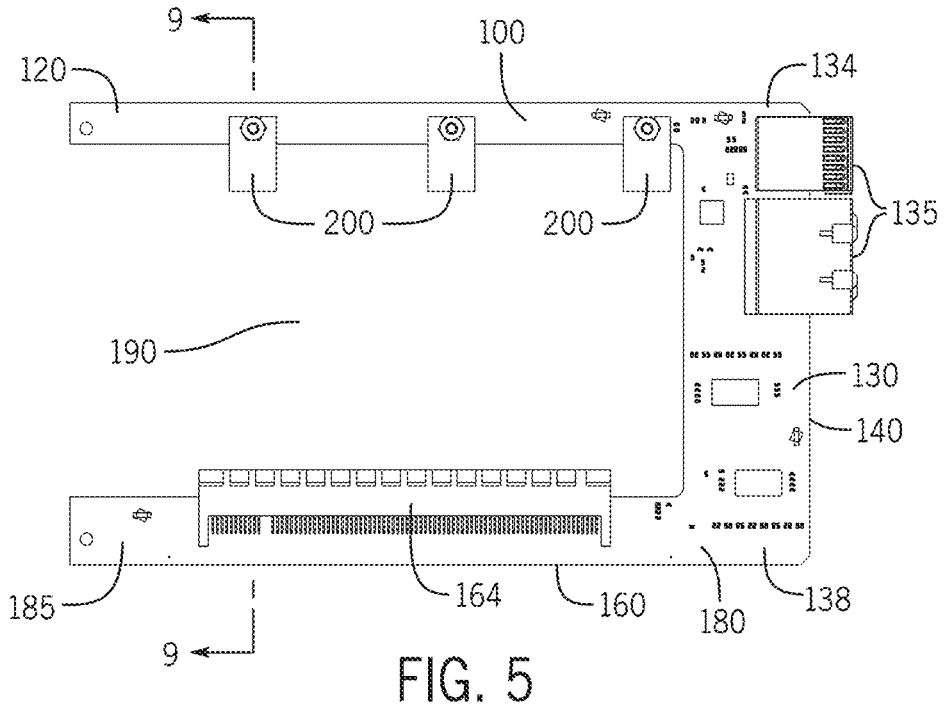
FIG. 5 is a side view of the carrier card.
Figures 6, 7, 8:
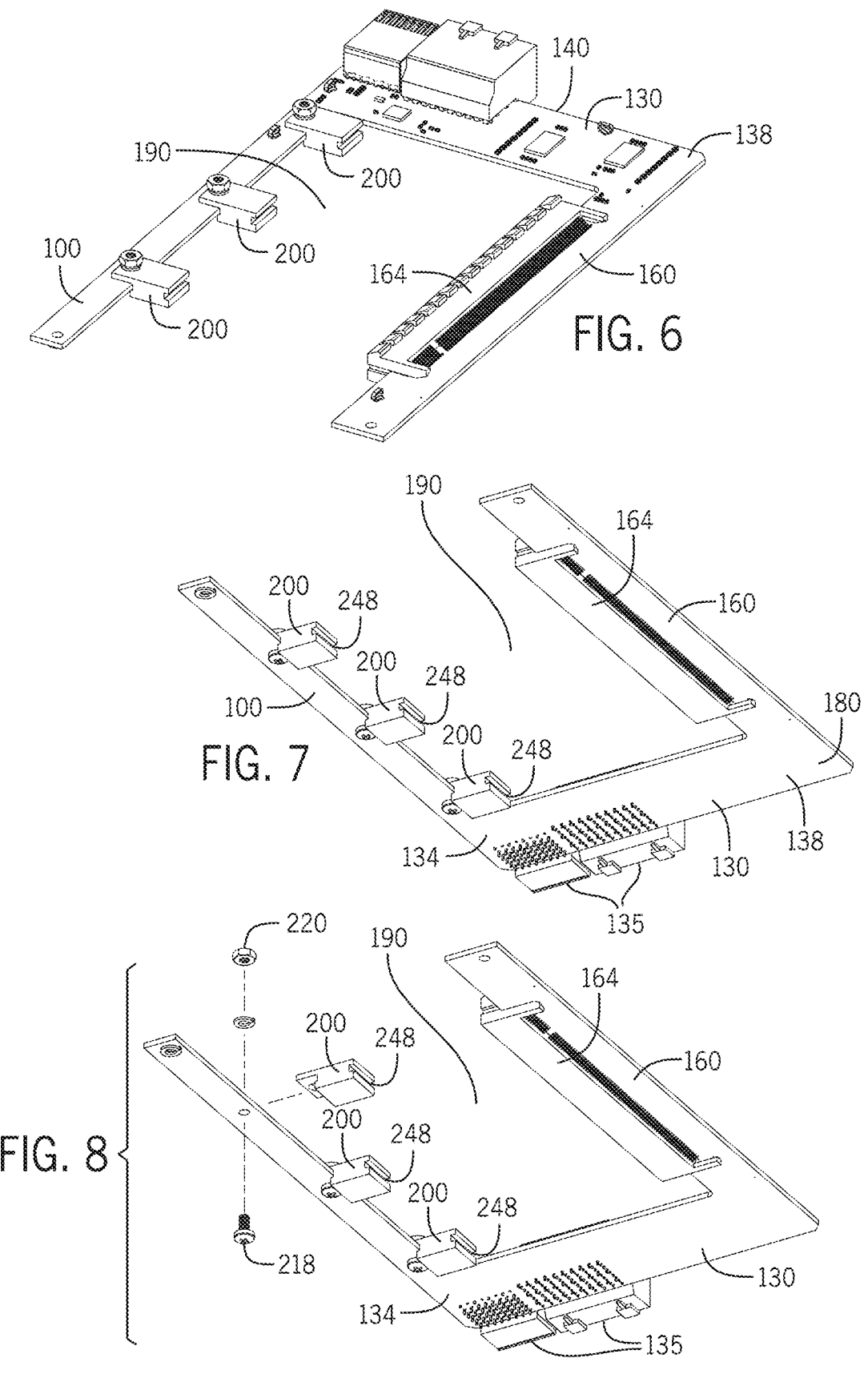
FIG. 6 is a perspective view of the carrier card.
FIG. 7 is a perspective view of the carrier card.
FIG. 8 is a perspective view of the carrier card and mounting brackets.

For purposes of this application, any terms that describe relative position (e.g., "upper", "middle" "lower", "outer", "inner", "above", "below", "bottom", "top", etc.) refer to an embodiment of the invention as illustrated, but those terms do not limit the orientation in which the embodiments can be used.

A carrier card 50 will now be described with reference to FIGS. 1-13. The carrier card 50 holds a daughter card 70. An assembly 90 of the carrier card 50 and the daughter card 70 provides a reduced overall width. The carrier card 50 adapts the smaller daughter card 70 to operate in the environment of the carrier card 50.

When the daughter card 70 is engaged to the carrier card 50 in the assembly 90, a combined width of the assembly 90 is often small enough to avoid consuming, interfering with or blocking an adjacent slot in a backplane or motherboard of a computer system or other electronic device. Both the carrier card 50 and the daughter card 70 may include printed circuit board (PCB) assemblies. In some aspects, the carrier card 50 transfers or adapts signals to and from the daughter card 70 to the computer system or other electronic device that hosts the carrier card 50. In some aspects, the carrier card 50 may only provide physical support for the daughter card 70 so that the daughter card 50 may reside in the chassis or system that is the target for the carrier card 50. In some aspects, the carrier card 50 may provide power to the daughter card 70.

The daughter card 70 may include a format of, for example, M.2 SSDs, FMCs, XMCs, MXMs, OCP modules, Com Express modules, PCIe add-in-cards, etc. The daughter card 70 may also include other printed circuit board assemblies commonly referred to as add-in-cards or mezzanine cards.

The carrier card 50 may support target formats that include, for example, PXIe, PCIe, CPCIe, VPX, PCIe, PC-104, etc. The carrier card 50 may be shaped and configured to suit the respective target format. The size and shape of the carrier card 50 may vary to correspond to the specific slot width or pitch of the target format. In some aspects, the carrier card 50 includes a mating electrical and/or optical connector 164 to connect with a daughter card mating electrical and/or optical connector 74 of the daughter card 70. The mating electrical and/or optical connector 164 of the carrier card 50 may be changed as needed to match the particular format of the carrier card 50 and the daughter card 70. For example, the daughter card 70 includes the male electrical connector 74 for PCI express and the carrier card 50 includes the mating electrical and/or optical connector 164 for PCI express. In other daughter cards 70, the electrical and/or optical connector 74 may vary and in other carrier cards 50, the mating and/or optical connector 164 may vary. In some aspects, there may be no electrical connection between the carrier card 50 and the daughter card 70. The daughter card 70 includes a front surface 76 and a rear surface 78 (shown in FIG. 3).

The carrier card 50 includes an upper member 100, a lateral member 130, a lower member 160, and a front panel 300. The upper member 100, the lateral member 130, and the lower member 160 form or define a void 190 configured to receive the daughter card 70. The upper member 100, the lateral member 130, and the lower member 160 form a U-shape with the void 190 positioned between the upper member 100 and the lower member 160 and to a side of the lateral member 130. The void 190 is a mostly open space between the upper member 100, the lateral member 130, and the lower member 160. The upper member 100 may extend from the lateral member 130, and the lower member 160 may extend from the lateral member 130.

In this aspect, the upper member 100 is generally perpendicular to the lateral member 130, and the lower member 160 is generally perpendicular to the lateral member 130. In this aspect, the upper member 100 is generally parallel to the lower member 160. A rear portion 110 of the upper member 100 transitions or is integral with an upper portion 134 of the lateral member 130. A rear portion 180 of the lower member 160 transitions or is integral with a lower portion 138 of the lateral member 130. The upper member 100, the lateral member 130, and the lower member 160 may be one substrate or may include multiple substrates that are interconnected. For example, the upper member 100, the lateral member 130, and the lower member 160 may include separate printed circuit boards that are mounted together.

The front panel 300 engages to a front portion 120 of the upper member 100 and to a front portion 185 of the lower member 160. In certain aspects, the front panel 300 may also engage with a front edge 80 of the daughter card 70. With respect to FIG. 2, an upper mount 310 secures the front panel 300 to the front portion 120 of the upper member 100, and a lower mount 314 secures to a front portion 185 of the lower member 160. The front panel 300 provides structural integrity for the carrier card 50 and the daughter card 70. The front panel 300 may vary depending upon the input/output of the respective daughter card 70. For example, the front panel 300 may vary depending upon the inputs, outputs or other connections, etc. of the daughter card 70. For example, the front panel 300 may or may not include I/O connectors.

Brackets, mounting members, or positioners are positioned between any of the upper member 100, the lateral member 130, the lower member 160 and the daughter card 70. The brackets, mounting members, or positioners may be friction mounted, fastener mounted, etc. The brackets, mounting members, or positioners, secure the daughter card 70 to the carrier card 50. In the aspect of FIGS. 1-13, one or more brackets 200 are configured to engage or hold the daughter card 70. The one or more brackets 200 are positioned between the upper member 100 and the daughter card 70. The one or more brackets 200 may fasten to the upper member 100 and press against a top edge 72 or upper surface of the daughter card 70. In other aspects, the mounting brackets 200 may also be positioned on the lateral member 130, the lower member 160, or combinations thereof. A combination of the brackets 200 and the engagement of the electrical and/or optical connector 74 of the daughter card 70 and/or the front panel 300 which is connected to the front edge 80 of the daughter card 70, along with the mating electrical and/or optical connector 164 of the carrier card 50 secures or holds the daughter card 70 in place in the void 190 of the carrier card 50.

Figure 8A:
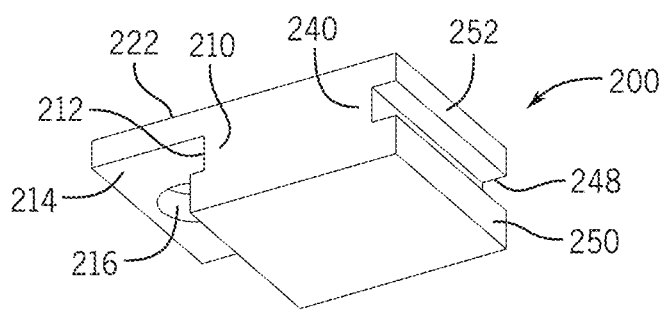
FIG. 8A is a perspective view of the mounting bracket.
Figure 9:
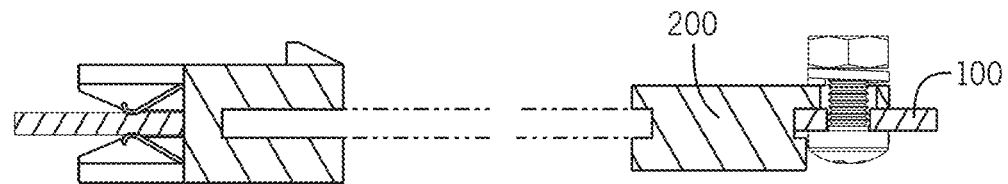
FIG. 9 is a sectional view of the carrier card and mounting brackets along the line 9-9 of FIG. 5.

With reference to FIG. 8A, the bracket 200 will now be described in detail. The bracket 200 includes an upper portion 210 and a lower portion 240. The upper portion 210 is generally oppositely disposed of the lower portion 240. The upper portion 210 is secured to, holds, or engages the upper member 100, while the lower portion 240 is secured to, holds, or engages the top edge 72 or upper surface of the daughter card 70.

In this aspect, the upper portion 210 includes an upper groove 212 that is shaped and configured to hold a lower edge 102 of the upper member 100. The upper portion 210 further includes a tab 214 having an opening 216 to receive a fastener 218. The upper member 100 further includes an opening 104 to receive the fastener 218. In this aspect, the fastener 218 includes a screw that receives a nut 220. In other aspects, other fasteners, such as, rivets, bolts, snaps, clips, etc. may be used to secure the bracket 200 to the upper member 10, the lateral member 130, and/or the lower member 160. In this aspect, the tab 214 forms a wall of the upper groove 212. In this aspect, the tab 214 is adjacent to the upper groove 212. A rear surface 222 of the tab 214 may be flush against either the front surface 76 or the rear surface 78 of the daughter card 70 when the bracket 200 is engaged to the lower edge 102 of the upper member 100.

In this aspect, the upper portion 210 includes a single tab 214 on a side of the upper portion 210. This provides clearance for the installation of the bracket 200 between the top edge 72 of the daughter card 70 and the lower edge 102 of the upper member 100. In this aspect, the lower portion 240 includes a lower groove 248 that is shaped and configured to receive the top edge 72 of the daughter card 70. A front wall 250 and a rear wall 252 may form the lower groove 248. The top edge 72 of the daughter card 70 may wedge into the lower groove 248. In other aspects, other edges or surface of the daughter card 70 may fit into and/or be held by the bracket 200 or other mounting member. For example, a rear or lower edge of the daughter card 70 may fit into a groove or otherwise fasten to the bracket 200 or other mounting member.

In the aspects of FIGS. 1-13, three brackets 200 are utilized. In other aspects, one, two, three, four, five, or more brackets 200 may be utilized depending upon the size, shape, and other requirements of the carrier card 50 and the daughter card 70. The mounting brackets 200 may also be located elsewhere, either on the lateral member 130, upper member 100, the lower member 160, and/or the front panel 300 of the carrier card 50.

The bracket 200 may be formed from a flexibly resilient material, such as a thermoplastic elastomer or rubber that, when installed, provides a bias between the upper member 100 and the daughter card 70. This bias helps to maintain the connector 74 of the daughter card 70 seated in the mating electrical and/or optical connector 164 of the lower member 160 of the carrier card 50. In certain aspects, the bracket 200 may be configured to wedge in between the upper member 100 and the daughter card 70 without the use of fastener 218.

A front panel 300 engages to the upper member 100 and the lower member 160. The front panel 300 may include an ejector 304 (or other handle) and a positioner 308. The front panel 300 may also include screws, such as screw 305, or other fasteners for securing the front panel 300 to the computer system or electronic device. Different versions of the front panel 300 may be supplied to conform to different target environments (e.g., PCIe, PXIe, VPX, etc.) and to match and secure different types of daughter cards 70, which may require a different operating environment. In the aspect of FIGS. 1-11, the daughter card 70 is a GPU (graphic processing unit) card that includes four 4 mini display port connectors 77. The front panel 300 includes a snout portion 320 with four openings 332 for the four 4 mini display port connectors 77. The snout portion 320 may protrude from the front panel 300. The snout portion 320 is configured to enclose a forward edge of the daughter card 70. The snout portion 320 accommodates daughter cards 70 that have a length that extends beyond the front panel 300. The snout portion 320 also accommodates a variety of connectors on different types of daughter cards 70. For example, different types of connectors may be used in the front panel 300 and/or the snout portion 320 that reflect the unique nature of the daughter card 70. For example, an ethernet card, as the daughter card 70, may employ RJ45, SFP+, QSFP, QSFP28 or other types of common ethernet connectors. For example, a GPU, as the daughter card 70, may employ display port, mini display port, HDMI, mini HDMI or other types of video connectors, etc. The snout portion 320 is tailored to meet the I/O characteristics of the daughter card 70. In other aspects, the front panel 300 does not include the snout portion 320. For example, the front panel 300 may have a generally flush or planar exterior.

The lower member 160 includes the mating electrical and/or optical connector 164 to connect with the electrical and/or optical connector 74 of the daughter card 70. The mating electrical and/or optical connector 164 may positioned or formed along an upper surface 166 of the lower member 160. In addition, the mating electrical and/or optical connector 164 may be placed on the upper member 100, lateral member 130 or even the front panel 300, as needed to provide and optimal fit for the daughter card 70 and the carrier card 50. The mating electrical and/or optical connector 164 may include electrical, optical, or a combined connector of both electrical and optical.

The lateral member 130 further includes a carrier card electrical and/or optical connector 135 along a rear portion 140 of the lateral member 130. The type and style of the carrier card electrical and/or optical connector 135 may vary depending upon the type of carrier card 50 and the target environment (e.g., PXIe, CPCIe, VME, etc.) The carrier card electrical and/or optical connector 135 connects with a mating electrical and/or optical connector in the slot of the backplane or motherboard of the computer system or other device. The carrier card electrical and/or optical connector 135 may include electrical, optical, or a combined connector of both electrical and optical.

The carrier card 50, with its U-shaped design, also allows forced air from the chassis of the computer system or electronic device that holds the carrier card 50 to cool the rear surface 78 of the daughter card 70, which is important as many daughter card 70 designs have active components on the rear surface 78 of the daughter card 70. Conventional carrier cards cannot cool the backside of the daughter card, unless they have some type of additional passive or active cooling measures, which adds cost, may consume power, and may also add to the overall width of the total assembly.

Figure 10:
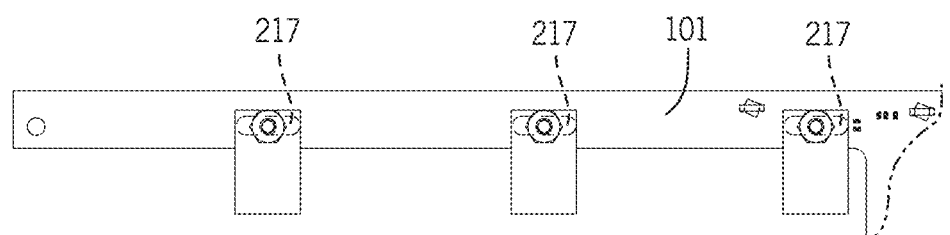
FIG. 10 is a view of the adjustable mounting bracket.
Figures 11A, 11B:
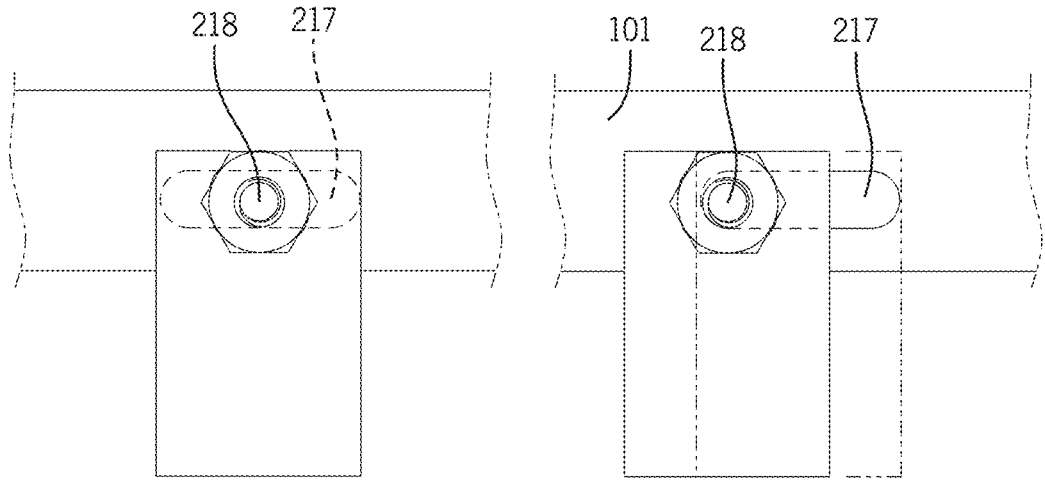
FIG. 11A is a view of the adjustable mounting bracket.
FIG. 11B is a view of the adjustable mounting bracket.

With respect to FIGS. 10, 11A, and 11B, a second upper member 101 is illustrated. In this aspect, the second upper member 101 includes one or more slots 217 configured to receive the fastener 218 in an adjustable arrangement. The slots 217 are generally parallel to a length of the second upper member 101. Depending on the shape, contour, or other features of the top edge 72 of the daughter card 70, the brackets 200 may be adjustably positioned in the slots 217. A lateral position of the brackets 200 relative to the second upper member 101 may be adjusted in view of the shape, contour, or other features of the top edge 72 of the daughter card 70. In other aspects, a single continuous slot may receive multiple fasteners 218. In other aspects, a combination of slots 217 and openings 216 may be utilized. In the aspects of FIGS. 1-11, the brackets 200 are shown on the upper members 100 and 101. In other aspects, the mounting brackets 200 may also be placed on the lateral member 130, the lower member 160, and/or the front panel 300.

Figures 12, 13:
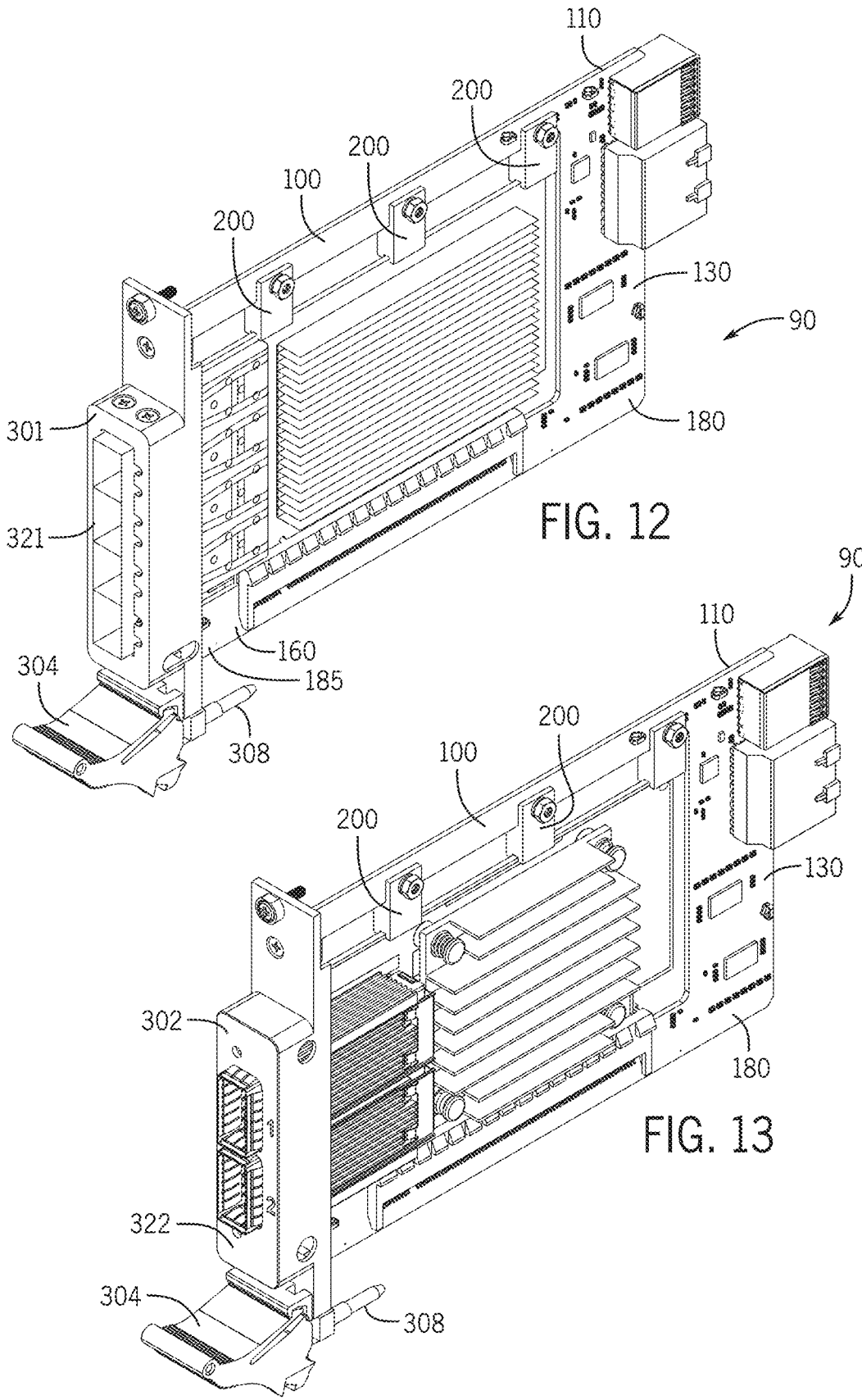
FIG. 12 is a perspective view of the carrier card assembly with a 10 GbE NIC card as the daughter card.
FIG. 13 is a perspective view of the carrier card assembly with a 100 GbE NIC card as the daughter card.

In the aspect of FIGS. 1-11, the daughter card 70 is a GPU (graphic processing unit) card. In the aspect of FIG. 12, the carrier card 50 is shown with 10 Gigabit Ethernet (GbE) Network Interface Card (NIC) as the daughter card 70. A front panel 301 includes a snout portion 321 to match the input/output connectors of the 10 GbE card. In FIG. 13, the carrier card 50 is shown with a 100 Gigabit Ethernet (GbE) card as the daughter card 70. A front panel 302 includes a snout portion 322 to match the input/output connectors of the 100 GbE NIC.

The carrier card 50 may include a standalone device, motherboard, single board computer, router or other device that also acts as a carrier card for a peripheral device daughter card. The carrier card 50 may be include any suitable format, such as, for example: 2.5 Inch Drive Tray with SATA, SAS, FC or NVMe I/F, 3.5 Inch Drive Tray with SATA, SAS, FC or NVMe I/F, 3.5 Inch, 4×4 Inch, AMC, AT (Advanced Technology), ATCA, ATX, AXI, AXIe, Baby-AT, BTX (Balanced Technology Extended), CEM, COM Express, COM-HPC, CoreExpress, CPCIe, DTX, EBX, EDSFF, Enhanced Extended ATX (EEATX), EPIC, ETX, Extended ATX (EATX), Femto-ITX, FlexATX, FMC, HPTX, LPX, M.2, microATX, MicroBTX (or uBTX), Mini-ATX, Mini-ITX, Mini-LPX, Mini-PCIe, Mini-STX, Mobile-ITX, MTCA, MXM, Nano-ITX, Neo-ITX, NGFF, NLX, NUC, OAM, OCP, OpenVPX, PC/104, PC/104-Plus, PCI/104-Express, PCIe, PicoBTX, Pico-ITX, PXIe, SmartModule, SSI CEB, SSI EEB, SSI MEB, SWTX, U.2, SXM, USB, UTX, VPX, WTX, XMC, XT, and XTX.

The daughter card 70 may include any suitable format, such as, for example: AMC, ATCA, AXI, AXIe, CEM, COM Express, COM-HPC, CoreExpress, CPCIe, EDSFF, FMC, M.2 SSD, Mini-PCIe, MTCA, MXM, NGFF, OAM, OCP, OpenVPX, PC/104, PC/104-Plus, PC104, PC104-Plus, PCI/104-Express, PCIe, PCIe/104, PCIe104, PMC, PXIe, SXM, U.2, USB, VPX, or XMC. The daughter card 70 may include a standalone device, such as a standalone daughtercard with a cable or other interface to the carrier card 50 as opposed to an electrical or optical connector. This could be used in aspects where a device needs to be very low profile and a special card is needed. For example, a USB SSD could be cabled to the carrier card 50.

In other aspects, a daughter card that does not have an electrical connection to the carrier card 50 may be positioned in the carrier card 50. In such an arrangement, the daughter card simply uses the infrastructure of the carrier card 50 to be mounted in the computer system or electronic device. For example, a USB drive may be positioned into the carrier card 50. The USB drive only uses the carrier card 50 for physical infrastructure. The USB drive may get power and signal via a USB connector that goes to the front panel 300. In view of the U-Shaped design of the carrier card 50, the assembly of the USB drive and the carrier card 50 still fits in one slot.

As such, it should be understood that the disclosure is not limited to the particular aspects described herein, but that various changes and modifications may be made without departing from the spirit and scope of this novel concept as defined by the following claims. Further, many other advantages of applicant's disclosure will be apparent to those skilled in the art from the above descriptions and the claims below.

What is claimed is:

1. A carrier card for connection to a backplane or av motherboard, comprising:
   a lateral member of a printed circuit board;
   an upper member of the printed circuit board extending from the lateral member;
   a lower member of the printed circuit board extending from the lateral member;
   the upper member, the lateral member, and the lower member form or define a void, wherein the void is configured to receive a daughter card in a coplanar arrangement with the lateral member, the upper member, and the lower member;
   a front panel engaged to one or both of the upper member and the lower member;
   a carrier card connector engaged to one of the lateral member, the upper member, or the lower member; and
   a mating connector engaged to one of one of the lateral member, the upper member, or the lower member.

2. The carrier card for connection to a backplane or a motherboard according to claim 1, wherein the void includes open space between the lateral member, the upper member, and the lower member.

3. The carrier card for connection to a backplane or a motherboard according to claim 1, wherein the void is positioned between the upper member and the lower member.

4. The carrier card for connection to a backplane or a motherboard according to claim 1, wherein the upper member, the lateral member, and the lower member form a U-shape around the void.

5. The carrier card for connection to a backplane or a motherboard according to claim 1, wherein the mating connector is configured to engage a connector of the daughter card.

6. The carrier card for connection to a backplane or a motherboard according to claim 5, wherein the mating connector is an electrical, optical, or combined connector.

7. The carrier card for connection to a backplane or a motherboard according to claim 1, wherein the carrier card connector is configured to engage to a connector of a motherboard, computer system, or electronic device.

8. The carrier card for connection to a backplane or a motherboard according to claim 7, wherein the carrier card connector is an electrical, optical, or combined connector.

9. The carrier card for connection to a backplane or a motherboard according to claim 1, wherein the front panel includes a snout portion.

10. The carrier card for connection to a backplane or a motherboard according to claim 9, wherein the snout portion protrudes from the front panel, and the snout portion is configured to enclose a forward edge of the daughter card.

11. The carrier card for connection to a backplane or a motherboard according to claim 1, further comprising a bracket configured to secure to the daughter card.

12. The carrier card for connection to a backplane or a motherboard according to claim 11, where the bracket comprises a groove, and the groove is configured to receive an edge of the daughter card.

13. The carrier card for connection to a backplane or a motherboard according to claim 11, wherein the bracket is configured to bias against the daughter card.

14. The carrier card for connection to a backplane or a motherboard according to claim 11, wherein the bracket fastens to the upper member and is configured to secure to an upper edge of the daughter card.

15. The carrier card for connection to a backplane or a motherboard according to claim 14, wherein the upper member, the lateral member, and the lower member are separate printed circuit boards that are mounted together.

16. The carrier card for connection to a backplane or a motherboard according to claim 11, wherein the bracket adjustably fastens to slots in the upper member.

17. The carrier card for connection to a backplane or a motherboard according to claim 1, wherein the front panel engages to a front portion of the upper member, a front portion of the lower member, and is configured to engage to the daughter card.

18. The carrier card for connection to a backplane or a motherboard according to claim 1, wherein the front panel is configured to engage to the daughter card.

19. The carrier card for connection to a backplane or a motherboard according to claim 1, wherein the upper member is generally perpendicular to the lateral member, and the lower member is generally perpendicular to the lateral member.

20. The carrier card for connection to a backplane or a motherboard according to claim 19, wherein the upper member and the lower member are generally parallel to each other.

21. The carrier card for connection to a backplane or a motherboard according to claim 1, wherein the upper member, the lateral member, and the lower member are integral portions of a printed circuit board assembly.

22. The carrier card for connection to a backplane or a motherboard according to claim 1, wherein the carrier card includes a format of 2.5 Inch Drive Tray with SATA, 2.5 Inch Drive Tray with SAS, 2.5 Inch Drive Tray with FC, 2.5 Inch Drive Tray with NVMe I/F, 3.5 Inch Drive Tray with SATA, 3.5 Inch Drive Tray with SAS, 3.5 Inch Drive Tray with FC, 3.5 Inch Drive Tray with NVMe I/F, 3.5 Inch, 4×4 Inch, AMC, AT (Advanced Technology), ATCA, ATX, AXI, AXIe, Baby-AT, BTX (Balanced Technology Extended), CEM, COM Express, COM-HPC, CoreExpress, CPCle, DTX, EBX, EDSFF, Enhanced Extended ATX (EEATX), EPIC, ETX, Extended ATX (EATX), Femto-ITX, FlexATX, FMC, HPTX, LPX, M.2, microATX, MicroBTX, uBTX, Mini-ATX, Mini-ITX, Mini-LPX, Mini-PCle, Mini-STX, Mobile-ITX, MTCA, MXM, Nano-ITX, Neo-ITX, NGFF, NLX, NUC, OAM, OCP, OpenVPX, PC/104, PC/104-Plus, PCI/104-Express, PCle, PicoBTX, Pico-ITX, PICMG, PXle, SmartModule, SSI CEB, SSI EEB, SSI MEB, SWTX, SXM, U.2, USB, UTX, VPX, WTX, XMC, XT, or XTX.

23. An assembly for connection to a backplane or a motherboard, comprising the carrier card according to claim 1 and the daughter card held in the void according to claim 1.

24. The assembly for connection to a backplane or a motherboard according to claim 23, wherein the daughter card includes a format of AMC, ATCA, AXI, AXIe, CEM, COM Express, COM-HPC, CoreExpress, CPCle, EDSFF, FMC, M.2 SSD, Mini-PCle, MTCA, MXM, NGFF, OAM, OCP, OpenVPX, PC/104, PC/104-Plus, PC104, PC104-Plus, PCI/104-Express, PCle, PCle/104, PCle104, PMC, PXle, SXM, U.2, USB, VPX, or XMC.

25. A carrier card for connection to a backplane or a motherboard, comprising:
    an upper member of a printed circuit board;
    a lateral member of the printed circuit board;
    a lower member of the printed circuit board;
    the upper member, the lateral member, and the lower member form or define a void;
    the void configured to receive a daughter card in a coplanar arrangement with the lateral member, the upper member, and the lower member;
    one of the upper member, the lateral member, or the lower member comprising a mating connector configured to connect with the daughter card; and a bracket engaged to one of the upper member, the lateral member, or the lower member, and the bracket configured to secure or fasten to an edge or surface of the daughter card.

26. A method of engaging a daughter card to a carrier card for connection to a backplane or a motherboard, comprising:
    providing a carrier card comprising an upper member of a printed circuit board, a lateral member of the printed circuit board, and a lower member of the printed circuit board;
    the upper member, the lateral member, and the lower member form or define a void, wherein the void is configured to receive a daughter card in a coplanar arrangement with the lateral member, the upper member, and the lower member; one of the upper member, the lateral member, or the lower member comprising a mating electrical connector;
    positioning the daughter card in the void;
    engaging a connector of the daughter card to the mating electrical connector of the carrier card; and
    positioning a bracket between the daughter card and one of the upper member, the lateral member, or the lower member of the carrier card.

27. The method of engaging a daughter card to a carrier card for connection to a backplane or a motherboard according to claim 26, further comprising positioning an edge of the daughter card in a groove of the bracket.

28. The method of engaging a daughter card to a carrier card for connection to a backplane or a motherboard according to claim 26, further comprising fastening the bracket to one of the upper member, the lateral member, or the lower member.

29. The method of engaging a daughter card to a carrier card for connection to a backplane or a motherboard according to claim 26, further comprising positioning the daughter card in the void in a coplanar arrangement with the carrier card.

* * * * *